(12) United States Patent
Osada et al.

(10) Patent No.: US 7,713,706 B2
(45) Date of Patent: May 11, 2010

(54) METHOD OF FIXING LOW-MOLECULAR COMPOUND TO SOLID-PHASE SUPPORT

(75) Inventors: Hiroyuki Osada, Wako (JP); Naoki Kanoh, Wako (JP)

(73) Assignee: RIKEN, Wako-shi (JP)

( * ) Notice: Subject to any disclaimer, the term of this patent is extended or adjusted under 35 U.S.C. 154(b) by 940 days.

(21) Appl. No.: 10/551,809

(22) PCT Filed: Mar. 25, 2004

(86) PCT No.: PCT/JP2004/004175

§ 371 (c)(1),
(2), (4) Date: Sep. 30, 2005

(87) PCT Pub. No.: WO2004/090540

PCT Pub. Date: Oct. 21, 2004

(65) Prior Publication Data

US 2006/0194251 A1    Aug. 31, 2006

(30) Foreign Application Priority Data

Apr. 9, 2003    (JP) .............................. 2003-104928

(51) Int. Cl.
*G01N 33/53* (2006.01)

(52) U.S. Cl. .................. 435/7.1; 435/174; 436/518; 422/50

(58) Field of Classification Search ............. None
See application file for complete search history.

(56) References Cited

U.S. PATENT DOCUMENTS 5,679,773 A * 10/1997 Holmes .................. 506/30
5,981,180 A * 11/1999 Chandler et al. ............... 435/6

FOREIGN PATENT DOCUMENTS

| JP | 2001-178472 | * | 3/2001 |
|---|---|---|---|
| JP | 2001-178472 A | | 7/2001 |
| JP | 2002-504695 A | | 2/2002 |
| WO | WO-97/16544 A1 | | 5/1997 |
| WO | WO-01/32935 A | | 5/2001 |
| WO | WO-02/26376 A | | 4/2002 |

OTHER PUBLICATIONS

Billig et al. (BioTechniques Molecular Laboratory Methods Series, 1998, 2 (Apoptosis Detection and Assay Methods), pp. 15-22, Abstract Only).*
Liu (Applied Biochemistry and Biotechnology—Part B Molecular Biotechnology, 2001, vol. 17, No. 2, pp. 183-185).*
MacBeth et al. (Journal of American Chemical Society, 1999, vol. 121, pp. 7967-7968).*
Translation of the International Preliminary Examination Report of International Application No. PCT/JP2004/004175, filed Mar. 25, 2004.
Sigrist et al., Optical Engineering, vol. 34, No. 8, pp. 2239-2348 (Aug. 1995).
MacBeath et al., Journal of American Chemical Society, vol. 121, No. 34, pp. 7967-7968 (1999).
Dorman et al., Trends in Biotechnology, vol. 18, No. 2, pp. 64-77 (2000).

* cited by examiner

*Primary Examiner*—Lisa V Cook
(74) *Attorney, Agent, or Firm*—Birch, Stewart, Kolasch & Birch, LLP.

(57) ABSTRACT

A method of fixing a low-molecular compound to a solid-phase support, by bringing a solution containing a low-molecular compound into contact with a solid-phase support having a photoreactive compound bonded to the surface, evaporating the solution containing a low-molecular compound to dryness, in the state of being in contact with the solid-phase support, and irradiating the solid-phase support with light to form a covalent bond between the photoreactive compound and the low-molecular compound. This fixing method enables a low-molecular compound to be fixed to a solid-phase support without the aid of a functional group.

14 Claims, 3 Drawing Sheets

METHOD OF FIXING LOW-MOLECULAR COMPOUND TO SOLID-PHASE SUPPORT

TECHNICAL FIELD

The present invention relates to a method of fixing a low-molecular compound on a solid-phase support, a low-molecular microarray produced by the method, a method of detecting a substance capable of interacting with a low-molecular compound utilizing the method, and a method of identifying the interaction site on a low-molecular compound.

BACKGROUND ART

A low-molecular microarray in which a various types of low-molecular compounds are introduced in trace quantities and fixed to a support, typically a glass slide, is useful as a tool for development of inhibitors for and functional analysis of proteins such as enzymes. However, in the conventional production processes of low-molecular microarrays, fixing of a low-molecular compound requires that all of the fixed low-molecular compounds have a functional group such as a hydroxyl or amino group. Therefore, it has only been possible to array a class of synthetic combinatorial library compounds (Non-patent reference No. 1). In a low-molecular compound, the part containing such a functional group in the structure of the compound faces toward the support on the binding side, and therefore has been of no use in protein-binding experiments on arrays. However, when a low-molecular compound is removed out from an array and then dissolved in a solvent, or when the compound before fixing to an array is dissolved in a buffer or the like, the possibility of the occurrence of interactions between that part of the low-molecular compound and indefinite proteins may arise, which has been thought to be a cause of adverse side reactions occurring during the development of pharmaceuticals.

On the other hand, it has been previously reported that a photoreactive compound can be used for fixing DNA molecules on a solid-phase support (Patent reference No. 1). It is considered that by applying this fixing technique to the production process for a low-molecular microarray, the problems inherent to the conventional low-molecular microarray production processes as stated above could be overcome. However, to date, there has been no report about the application of the above-described DNA-fixing process to the fixing of low-molecular compounds.

[Patent reference No. 1] Japanese Patent Application Laid-open No. 2001-178472
[Non-patent reference No. 1] MacBeath et al., J. Am. Chem. Soc., 1999, 121, 7967

DISCLOSURE OF THE INVENTION

As stated above, in conventional processes for production of low-molecular microarrays, the low-molecular compounds which can be fixed is limited to a class of molecules having a specific functional group and the functional group-containing part of the molecular structure, which is utilized for the binding to a support, is of no use in experiments of binding to proteins or the like on arrays.

The present invention is accomplished in these technical situations. Therefore, the object of the present invention is to provide a process for producing a low-molecular microarray without any problem as stated above.

The present inventor has made intensive and extensive studies with the aim of solving the above-stated problems. As a result, the inventor has found that, by fixing a low-molecular compound on a support using a photoreactive compound, the low-molecular compound can be fixed in the functional group-independent manner, and has accomplished the present invention.

Accordingly, the present invention relates to a method of fixing a low-molecular compound on a solid-phase support, comprising the steps of:
(1) bringing a solution containing a low-molecular compound into contact with a solid-phase support having a photoreactive compound bonded to the surface;
(2) evaporating to dryness the solution containing the low-molecular compound in the state of being in contact with the solid-phase support; and
(3) irradiating the solid-phase support with light to form a covalent bond between the photoreactive compound and the low-molecular compound.

The present invention also relates to a low-molecular microarray produced by the method as described above.

The present invention further relates to a method of detecting a substance capable of interacting with a low-molecular compound, comprising the steps of:
(1) bringing the low-molecular microarray into contact with a solution which contains a test substance to be detected having a label;
(2) removing any substance which fails to bind to the low-molecular compound; and
(3) detecting the label of the test substance.

The present invention still further relates to a method of identifying an interaction site on a low-molecular compound, comprising the steps of:
(1) mixing a photoreactive compound with a low-molecular compound capable of interacting with a given substance;
(2) irradiating the mixture with light to form a covalent bond between the photoreactive compound and the low-molecular compound;
(3) separating complexes of the photoreactive compound and the low-molecular compound into different groups in accordance with the difference in binding site on the low-molecular compound;
(4) fixing each of the separated complexes on a support for a microarray;
(5) bringing the complexes fixed to the support into contact with a solution containing the given compound which has a label; and
(6) among the complexes fixed to the support, selecting those complexes from which the label is not detected, to identify the binding site between the low-molecular compound and the photoreactive compound on the complexes.

Hereinafter, the present invention will be described in detail.

The method of fixing a low-molecular compound on a solid-phase support according to the present invention comprises steps (A-1) to (A-3) below.

In step (A-1), a solution containing a low-molecular compound is brought into contact with a solid-phase support having a photoreactive compound bound to the surface.

The photoreactive compound is not particularly limited as long as it can be activated by light irradiation to form a covalent bond between it and the low-molecular compound. Examples of the photoreactive compound include the compounds of the following (a) to (c).

(a) Compounds capable of generating a nitrene, a carbene, a radical or a carbon electrophilic agent:

Compounds capable of generating these active species are described in, for example, Japanese Patent Application Laid-open No. 2001-178472, a review by S. A. Fleming, Tetrahedron Letters, vol. 51, pp. 12479-12520, 1995, and a review by Yasumaru Hatanaka, the Journal of Synthetic Organic Chemistry, Japan, vol. 56, pp. 581-590, 1998. For example, compounds capable of generating a nitrene include those compounds which have an azide group such as aromatic azides, alkyl azides and heterocyclic azides; compounds capable of generating a carbene include those compounds which have an diazo or diazirine group; compounds capable of generating a radical include conjugated ketones such as benzophenones and enones, aromatic halides and olefins; compounds capable of generating a carbon electrophilic agent include aromatic diazonium salts, nitrobenzenes, sulfonium salts, phosphonium salts and ammonium salts.

(b) Compounds compound having a diazonium, azide, diazirine or diazo group as a part of the structure:

Compounds having these parts in the structures also described in Japanese Patent Application Laid-open No. 2001-178472 cited above and so on.

(c) Compound represented by formula (I):

wherein X denotes —N$_3$, —C*(R$^1$)N=N* (both the "*"s are linked together to form a three-membered ring), —N$_2$$^+$Z$^-$, —C(R$^2$)=O, —CH=CH$_2$, —NO$_2$, —NH$_2$, —C(=O)N$_3$, —Cl or —NH—CH$_2$—CO—CH=N$_2$; R$^1$ denotes a hydrogen atom, an alkyl group which may have a substituent or an aryl group which may have a substituent; R$^2$ denotes an aryl group which may have a substituent; Z$^-$ denotes an anion; any one of Y$^1$, Y$^2$, Y$^3$, Y$^4$ and Y$^5$ denotes a group which is capable of reacting with a functional group carried on the surface of the solid-phase support to form a covalent bond and the other four members independently to one another denote a hydrogen or halogen atom:

In the compound represented by the formula (I), the group represented by R$^1$ is preferably an alkyl group having 1 to 6 carbon atoms which may have a substituent and a phenyl group having 6 to 12 carbon atoms which may have a substituent, and particularly preferably an alkyl group substituted by an electron-attracting group such as a fluorine atom. The group represented by R$^2$ is preferably a phenyl group. The anion represented by Z$^-$ is preferably an halide ion, a boron tetrafluoride ion or a phosphorus hexafluoride ion. The group capable of reacting with a functional group carried on the surface of the solid-phase support to form a covalent bond may be any one of Y$^1$, Y$^2$, Y$^3$, Y$^4$ and Y$^5$, and is preferably Y$^3$. Preferred examples of the group capable of reacting with a functional group carried on the surface of the solid-phase support to form a covalent bond include carboxyl, formyl, active ester, hydroxyl, thiol, sulfide, amino, halogen-substituted alkyl and trialkoxysilyl groups and substituted forms thereof.

Specific examples of the compound represented by the formula (I) include the following compounds 1 to 27, but are not limited thereto.

Compound 1

Compound 2

Compound 3

Compound 4

Compound 5

Compound 6

Compound 7

Compound 8

Compound 9

Compound 10

-continued

Compound 11

Compound 12

Compound 13

Compound 14

Compound 15

Compound 16

Compound 17

Compound 18

Compound 19

Compound 20

-continued

Compound 21

Compound 22

Compound 23

Compound 24

Compound 25

Compound 26

Compound 27

The method for fixing the photoreactive compound on the solid-phase support is not particularly limited. For example, the fixing can be carried out by the method as described in Japanese Patent Application Laid-open No. 2001-178472. The photoreactive compound is preferably bound directly to the surface of the solid-phase support; or another compound may be bound to the surface of the solid-phase support and the photoreactive compound may be bound indirectly through the compound. Alternatively, a precursor of the photoreactive compound may be bound to the surface of the solid-phase support and then subjected to a proper reaction treatment to convert the precursor into the corresponding photoreactive compound.

The solid-phase support may be any one as long as it can bind the photoreactive compound, including supports for microarrays (also refererd to as "microarray supports, hereinafter), beads, fibers, tubes and containers (e.g., test tubes, vials), most preferably supports for microarrays. A microarray support on which a low-molecular compound is fixed can be used as a low molecule microarray for the detection of proteins or the like. As for the materials for the solid-phase support, there may be mentioned, for example, glasses; cements; ceramics such as porcelains or new ceramics; polymers such as polyethylene terephtharate, cellulose acetate, polycarbonates from bisphenol A, polystyrene and polymethyl methacrylate; silicones; porous materials such as activated carbon, porous glasses, porous ceramics, porous silicones, porous activated carbon, fabrics, woven fabrics, nonwoven fabrics, filter papers, short fibers and membrane filters; and electrically conductive materials such as gold; and preferably glasses, silicones, gold and the like. The solid-phase support may be coated on its surface with a polymer such as poly cations so that an amino, carboxyl or hydroxyl group can be introduced onto the surface, or may be treated with a silane coupling agent having a substituent to be introduced onto the surface of the solid-phase support. Alternatively, the solid-phase support may be subjected to plasma treatment so that a reactive functional group can be introduced onto its surface.

As used herein, the term "a low-molecular compound" refers to an organic compound having primarily a carbon, hydrogen, oxygen, nitrogen or sulfur atom as the main constituent atom, such as a primary metabolite of an oligosaccharide, a polypeptide or the like; a secondary metabolite of a fatty acid, a polyletide (acetogenin), isoprenoid, phenylpropanoid, alkaroid or the like; a synthetic organic compound having an aromatic ring or a heterocyclic ring of about 200 daltons in molecular weight; or any complex thereof; in particular, a compound capable of inhibiting or enhancing the function of a protein by binding to the protein.

The solvent used for the preparation of the low-molecular compound solution can be suitably selected depending on the types of the low-molecular compound used. For example, water, dimethyl sulfoxide (DMSO), N,N-dimethylformamide (DMF), dioxane, acetonitrile or chloroform can be used. The concentration of the low-molecular compound solution may vary depending on the types of the low-molecular compound or the solvent used or depending on how the solution is contacted. For example, when a solution of a polyketide having a molecular weight of about 500 daltons in DMSO is added dropwise onto a solid-phase support, the concentration of the solution is about 0.1 to 10 mM; when a solution of a polypeptide having a molecular weight of about 1200 daltons in DMSO is added dropwise onto a solid-phase support, the concentration of the solution is about 0.1 to 100 mM.

The method of contacting the low-molecular compound solution with the solid-phase support may be any one as long as the low-molecular compound can be fixed to the solid-phase support by irradiation with light. For example, when a microarray support is used as the solid-phase support, a solution containing the low-molecular compound may be added dropwise onto the support. The amount of the solution added dropwise may vary depending on the types of the low-molecular compound used and the concentration of the solution, and is generally about 1 nL to 0.2 μL.

In step (A-2), the solution containing the low-molecular compound is evaporated to dryness in the sate of being in the contact with the solid-phase support.

The method of evaporation of the solution is not particularly limited, and the evaporation may be performed by natural drying (i.e., air drying). However, artificial drying with a vacuum pump or the like is preferred.

The evaporation to dryness of the solution provides the close contact of the low-molecular compound with the photoreactive group, leading to bonding of the low-molecular compound at its various sites to the photoreactive compound. As a result, all of the various sites of the low-molecular compound are exposed on the surface of the solid-phase support. This enables to totally examine the properties (e.g., binding property) of the low-molecular compound. The evaporation to dryness of the solution also provides an increased molecular density of the low-molecular compound, leading to the improvement of the efficiency of the reaction of the low-molecular compound with the photoreactive compound.

In step (A-3), the solid-phase support is irradiated with light to form a covalent bond between the photoreactive compound and the low-molecular compound.

The wavelength of the light irradiated may be selected depending on the types of the photoreactive compound used. In general, light with a wavelength in the range from 200 to 400 nm, preferably about 360 nm, is irradiated. The light source which can be utilized includes sunlight, light from a lamp such as a mercury lamp, light from a laser (e.g., a semiconductor laser, a solid state laser, a gas laser), luminescent light from a light emitting diode, luminescent light from an electroluminescent device and the like. The light irradiation can be performed by irradiating light from a light source (e.g., a mercury lamp) onto the surface of the solid-phase support uniformly, if required, through a suitable filter, or by mask exposure to form a desired pattern using a so-called "mask". Alternatively, light may be gathered with a lens or a mirror and then irradiated in a fine pattern, or light may be gathered and then scan-exposed. The time required for the irradiation is not particularly limited.

After the light irradiation, the solid-phase support is washed with a suitable solvent or buffer to remove the unbound molecules of the low-molecular compound. Thus, a solid-phase support having a low-molecular compound fixed thereon can be prepared.

The fixing method according to the present invention is applicable to the "method of detection of a substance capable of interacting with a low-molecular compound" and the "method of identification of the interaction site on the low-molecular compound" as described below.

The method of detection of a substance capable of interacting with a low-molecular compound according to the present invention comprises steps (B-1) to (B-3) below.

In step (B-1), a solution containing a test substance to be detected which has been labeled is contacted with the low-molecular microarray prepared by the fixing method of the present invention as described above.

The test substance used is not particularly limited. In most cases, a biological substance such as a protein is used. The method of labeling the test substance is not also particularly limited, and RI techniques and non-IR techniques (e.g., fluorescence technique, biotin technique) can be employed for the labeling.

The solution used for the preparation of the test substance solution may be suitably selected depending on the types of the test substance. For example, water, phosphate buffer, acetate buffer, Tris buffer and the like can be used. The concentration of the test substance solution may vary depending on the types of the low-molecular substance or the solvent used. For example, for a solution of a fluorescence-labeled protein with a molecular weight of about 160,000 daltons in a buffer, the concentration generally ranges from 10 to 100 μg/mL.

The method of contacting the test substance solution with the low-molecular microarray is not particularly limited. For example, the test substance solution may be added dropwise onto the microarray. The amount of the solution added dropwise may vary depending on the types of the test substance and the concentration of the solution, but is generally within the range from about 0.1 to 1 μL/mm$^2$.

In step (B-2), the substance which is unbound to the low-molecular compound is removed.

The removal of the substance which is unbound to the low-molecular compound is performed by washing out with a suitable buffer, solvent or the like.

In step (B-3), the label of the test substance is detected.

The method for detection of the label may be selected depending on the types of the labeling substance used. For example, when a fluorescent substance is used for the labeling, the label can be detected on a fluorescence slide scanner or the like.

In this step, if the presence of the label is detected, then the test substance is determined as a substance capable of interacting with the low-molecular compound; whereas if the presence of the label is not detected, then the test substance is determined as a substance not capable of interacting with the low-molecular compound.

In the conventional microarray techniques, a low-molecular compound is fixed to a solid-phase support by utilizing a specific functional group. In these cases, the part containing the functional group in the structure faces toward the support on the side where the low-molecular compound is bound to the solid-phase support and, therefore, is not exposed at the surface of the solid-phase support. Therefore, when the part containing the functional group in the structure is involved in the interaction between the test substance and the low-molecular compound, even if the test substance actually interacts with the low-molecular compound, there is a possibility that the test substance is falsely determined as a substance which does not interact with the low-molecular compound. To the contrary, according to the detection method of the present invention, because a microarray on which all parts of the structure of the low-molecular compound are exposed at the surface is used, the possibility of such a false determination as stated above can be avoided and a substance capable of interacting with a low-molecular compound can be detected with a high accuracy.

The method of identifying the interaction site on a low-molecular compound according to the present invention comprises steps (C-1) to (C-6) below.

In step (C-1), a photoreactive compound is mixed with a low-molecular compound capable of interacting with a given substance.

The photoreactive compound may take the form of powder or oil, and the same compounds as mentioned for the fixing method of the present invention can be used.

The low-molecular compound which can be used may be the same compound as mentioned for the fixing method of the present invention. In this method, however, a low-molecular compound which has been confirmed to interact with a certain substance is preferably used.

In step (C-2), the mixture is irradiated with light to form a covalent bond between the photoreactive compound and the low-molecular compound.

This step can be performed in the same manner as in step(A-3) of the fixing method of the present invention.

In step (C-3), complexes of the photoreactive compound and the low-molecular compound are separated into different groups in accordance with the difference in binding site on the low-molecular compound.

The method of separating the complexes is not particularly limited. For example, the separation can be performed by high performance liquid chromatography.

In step (C-4), the separated conjugates are fixed to an microarray support, respectively.

The fixing of the conjugates on the microarray support can be performed in the conventional manner. For example, the fixing may be performed by utilizing a functional group carried on the surface of the solid-phase support.

In step (C-5), the complexes fixed to the support is brought into contact with a solution containing the given substance which has been labeled.

This step can be performed in the same manner as in step (B-1) for the detection method of the present invention. It should be noted, however, that the substance to be contacted with the support is a substance which is previously confirmed to interact with the low-molecular compound, rather than a substance which is unknown whether it can interact with the low-molecular compound (i.e., test substance) or not.

In step (C-7), among the complexes fixed to the support, complexes from which no label is detected are selected, and then the binding site between the low-molecular compound and the photoreactive compound in the conjugate is identified.

The identification of the binding site can be performed by, for example, mass spectrometry, nuclear magnetic resonance spectrometry or the like.

Figure 1:
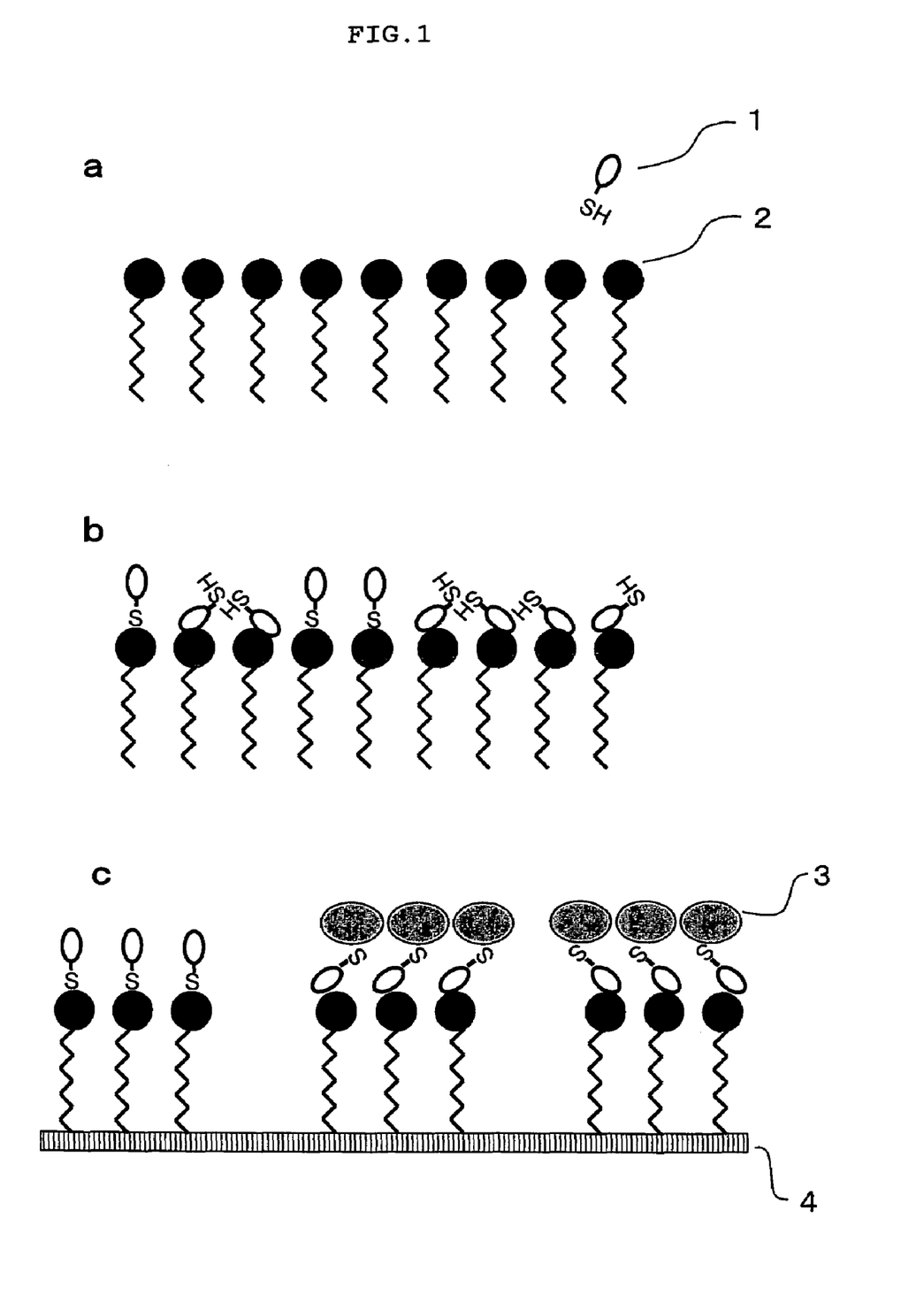
FIG. 1 is a schematic drawing illustrating the method of identifying the interaction site on a low-molecular compound according to the present invention.

The method of identifying the interaction site on a low-molecular compound will be described with reference to FIG. 1. A low-molecular compound 1 in FIG. 1 has an SH group which contributes to the interaction with a given substance 3. The low-molecular compound 1 binds to a photoreactive compound 2 during steps (C-1) to (C-2). The binding between the low-molecular compound 1 and the photoreactive compound 2 not only occurs at the SH group site but also at other various sites on the low-molecular compound (FIG. 1b). Conjugates of the low-molecular compound 1 and the photoreactive compound 2 are separated into different groups during steps (C-3) to (C-4) and then fixed to a support 4. When the given substance 3 is brought into contact with the low-molecular compound 1, all molecules of the low-molecular compound 1 should interact in principle with the certain substance 3, but some of the molecules of the low-molecular compound 1 may not (FIG. 1c). By analyzing the molecules of the low-molecular compound 1 which do not interact with the certain substance 3 in the structural view point (FIG. 1b), a site which interacts with the certain substance 3 on the low-molecular compound 1 (in this figure, a SH group) can be identified.

In the development of pharmaceuticals and the like, it is quite important to identify a site on a low-molecular weight compound which contributes to the interaction with a protein or the like. Conventionally, the identification of such a site has required complicated procedures of converting all the functional groups present on the low-molecular compound one by one to determine the presence or absence of the interaction. To the contrary, according to the present invention, such complicated procedures can be eliminated and the site which contributes to the interaction can be identified in only a single operation.

BEST MODE FOR CARRYING OUT THE INVENTION

Example 1

Introduction of Polyethylene Glycol Linker into Photophilic Atomic Group

To a solution of 4-(3-trifluroemthyl-3H-diazirin-3-yl)-benzoic acid (Compound A) (17.9 mg, 72.0 μmol), [2-[2-(2-amino-ethoxy)-ethoxy]-ethyl]-carbamic acid tert-butyl ester (Compound B) (73.8 mg, 297 μmol, 4.1 eq.) and N,N-dimethylaminopyridine (3.1 mg, 25.4 μmol, 0.35 eq.) in dry THF (1 mL) was added 1-[3-(dimethylamino)propyl]-3-ethylcarbodiimide hydrochloride (24.1 mg, 126 μmol, 1.7 eq.) at room temperature. The solution was stirred in the dark for 20 hours. The solvent was evaporated under reduced pressure, and the residue was purified by silica gel chromatography (1 g, chloroform:methanol=25:1) to yield 27.6 mg (59.9 μmol, yield:83%) of [2-(2-[2-[4-(3-trifluoromethyl-3H-diazirin-3-yl)-benzoylamino]-ethoxy]-ethoxy)-ethyl]-carbamic acid tert-butyl ester (Compound C).

The resulting Compound C (27.6 mg, 59.9 mol) was dissolved in dichloromethane (1 mL) and trifluoroacetic acid (150 μL) and stirred at room temperature for 70 minutes. The solvent was evaporated under reduced pressure and the residue was purified by reverse phase column chromatography (methanol:water=4:1, methanol) to yield 21.1 mg (44.5 mmol, yield: 74%) of
N-[2-[2-(2-aminoethoxy)-ethoxy]-ethyl]-4-(3-trifluoromethyl-3H-diazirin-3-yl)-benzamide trifluoroacetate (Compound D).

Compound D: colorless oil, $^1$H-NMR (400 MHz, CD$_3$OD) δ 7.90 (2H, brd, J=8.6 Hz), 7.34 (2H, d, J=8.6 Hz), 3.62-3.71 (8H, m), 3.58 (2H, t, J=4.8 Hz), 3.07 (2H, t, J=5.6 Hz).

The scheme of the reaction described above is shown in the following.

(a) EDCI • HCl, DMAP, DMF, r.t., 20 h, 83%; (b) CF$_3$CO$_2$H, CH$_2$Cl$_2$, r.t., 70 min.

Example 2

Modification of Glass Support

A mixed solution of N,N'-disuccinimidyl carbonate (74.2 mg,290 μmol), N,N-diisopropylethylamine (48 mL, 276 μmol) and DMF (600 μL) was added onto a aminated slide glass [a coated slide glass for DNA microarray (high density amino group-introduced type 1 slide), 76×26 mm; Matsunami Glass Ind. Ltd.] at a rate of 0.18 μL/mm$^2$ , and then treated at room temperature for 16 hours. The treated slide glass was washed with ethanol, deionized water, ethanol and deionized water in this order for 10 minutes each, dehydrated in a dehydration centrifuge (400×g) for 1 minute, and further dried in vacuo to give a succinimidylated slide.

Figure 2:
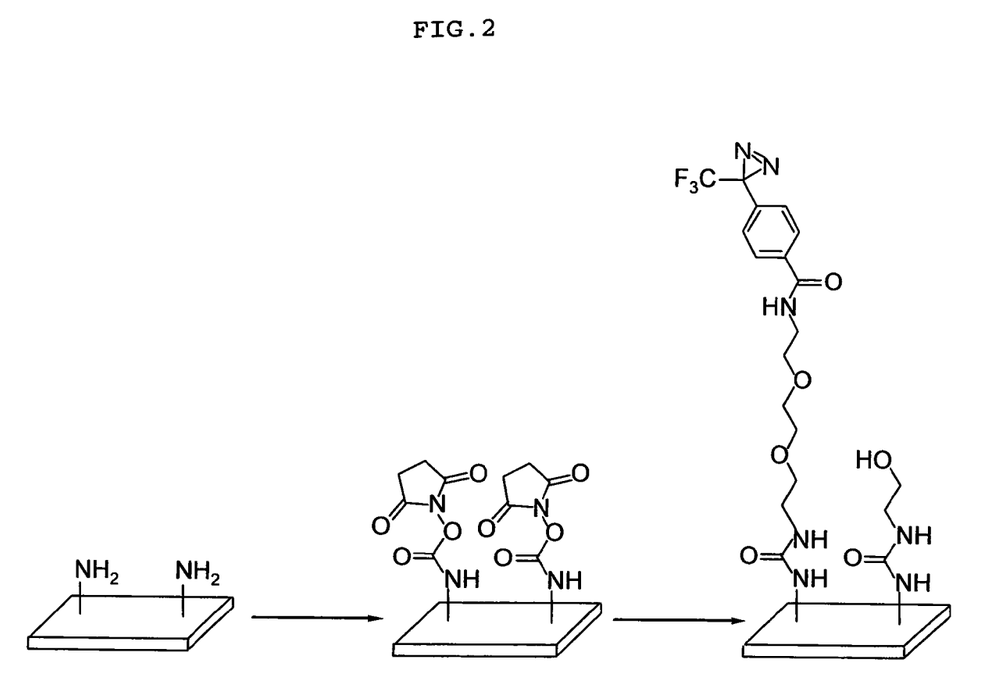
FIG. 2 is a drawing schematically illustrating the process of modifying a glass support.

Onto the resulting succinimidylated slide, a mixed solution of N-[2-[2-(2-amino-ethoxy)-ethoxy]-ethyl]-4-(3-trifluoromethyl-3H-diazir in-3-yl)-benzamido trifluoroacetate (Compound D) (17.4 mg, 37.7 μmol), N,N-diisopropylamine (40 μL, 230 μmol) and DMF (360 μL) was added at a rate of 0.11 μL/mm$^2$, and then treated in the dark at room temperature for 14 hours. Excess reagent remaining on the slide was removed with ethanol and deionized water in this order, and then dehydrated in a dehydration centrifuge (400 ×g) for 1 minute. The slide was added with a 1M ethanolamine solution in DMF at a rate of 72 nL/mm$^2$, and then subjected to blocking treatment in the dark at room temperature for 1 hour. Excess reagent remaining on the slide was removed with ethanol and deionized water in this order, and then dehydrated in a dehydration centrifuge (400×g) for 1 minute to give a photophilic atomic group-introduced slide. The scheme of the modification process described above is shown in FIG. 2.

Example 3

Fixing of Low-Molecular Compound

On the photophilic atomic group-introduced slide, 0.2 μL of each of solutions of low-molecular compounds (biotin, rhodamine B, digoxin) in DMSO, which had been prepared in concentrations of 100, 10, 1, 0.1 and 0.01 mM, was spotted. The slide was dried in an incubator at 35° C. for 3 hours and further dried with a vacuum pump for 20 hours. The slide was irradiated with ultraviolet ray having a wavelength of 365 nm for 30 minutes, and then excess low-molecular compound which failed to be fixed to the slide was washed out with ethanol. The slide was then washed while shaking by immersing in ethanol, DMF, THF, ethanol and deionized water in this order (for 1 hour each). Thus, a slide on which low molecules were fixed was produced.

The structures of biotin, digoxin and rhodamine B are shown below.

Biotin

Digoxin

Rhodamine B

Example 4

Detection of Low Molecule-Protein Bonding

Figure 3:
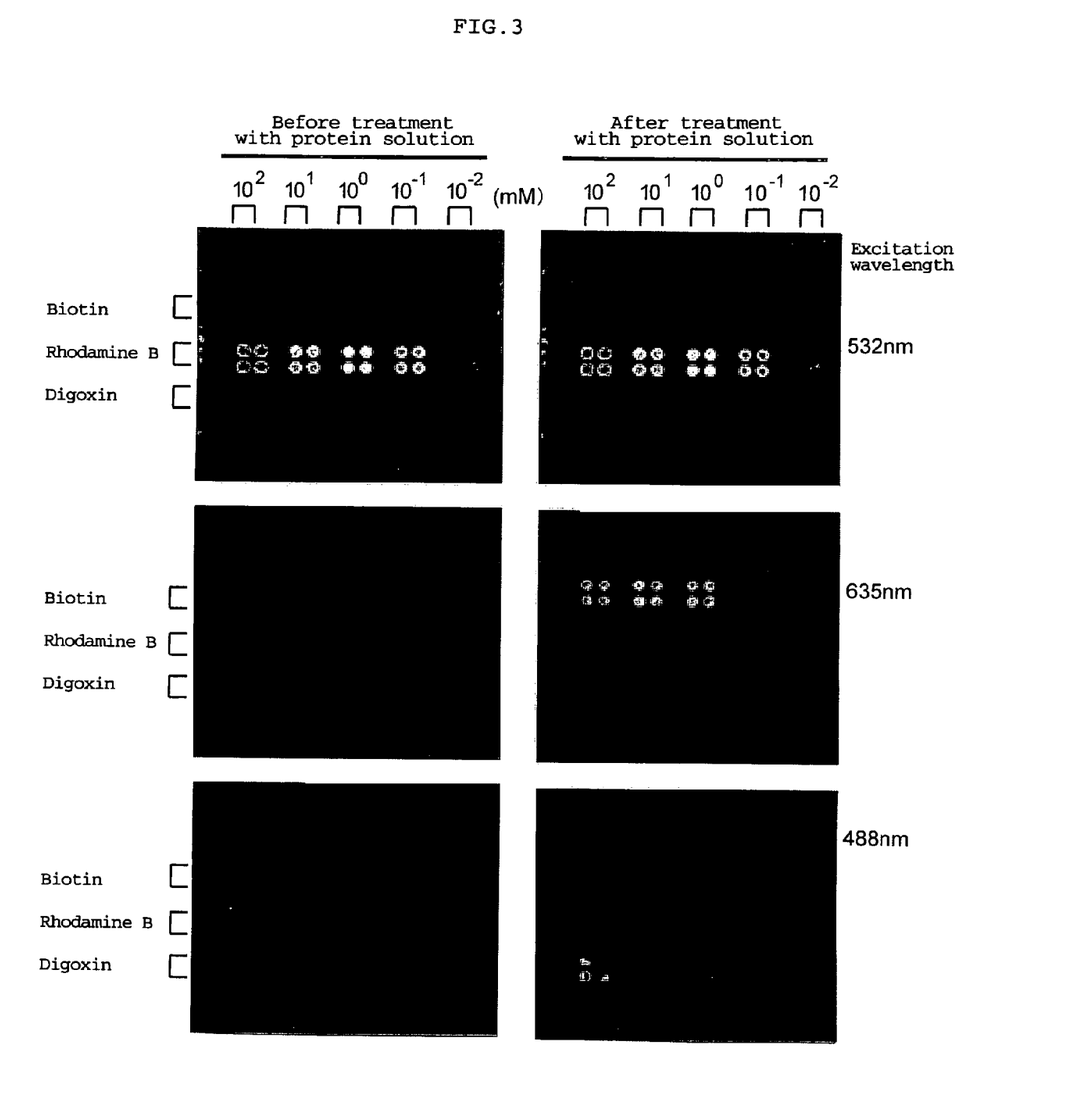
FIG. 3 shows images of a low-molecular compound-fixed slide observed on a fluorescent scanner after irradiating with light having wavelengths of 488 nm (FIG. 3C), 532 nm (FIG. 3A and 635 nm (FIG. 3B), respectively.

Onto the low molecule-fixed slide, a protein solution (162 µg/mL anti-digoxin monoclonal antibody clone DI-22-FITC conjugate, 3.7 µg/mL streptavidin-Alexa Fluor 633 conjugate, 1% (w/v) skimmed milk, 77 mM NaCl, 0.05% (w/v) TWEEN™ 20 (polysorbate 20), 50 mM Tris-HCl, pH 7.5) was added at a rate of 0.18 mL/mm$^2$, and then treated at room temperature for 1 hour. The slide was washed while shaking three times with a wash buffer (77 mM NaCl, 0.05% (w/v) TWEEN™ 20 (polysorbate 20), 50 mM Tris-HCl, pH 7.5), rinsed with deionized water, and dehydrated in a dehydration centrifuge (400×g) for 1 minute, The slide was exited with light of 488, 532 and 635 nm, respectively, and the emitted fluorescent light was observed on a fluorescent slide scanner. The results are shown in FIG. 3. In FIG. 3, the images in the left column are the slides observed on the fluorescent scanner before the slides were immersed in a protein solution, and the images in the right column are the slides observed on the fluorescent scanner after the slides were treated with a protein solution.

As shown in FIG. 3, when light with wavelength of 635 nm was irradiated, fluorescence was detected only at the areas on which the biotin solution was spotted, indicating that biotin was bound to the protein (streptavidin-Alexa Fluor 633 conjugate). When light with wavelength of 488 nm was irradiated, fluorescence was detected only at the areas on which the digoxin solution was spotted, indicating that digoxin was bound to the protein (anti-digoxin monoclonal antibody clone DI-22-FITC conjugate).

The specification includes all or part of the contents as described in the specification and/or drawings of Japanese Patent Application No. 2003-104928, which is a priority document of the present application. All publications, patents and patent applications cited herein are incorporated herein by reference in their entirety.

INDUSTRIAL APPLICABILITY

The fixed method according to the present invention enables a low-molecular compound to be fixed to a solid-phase support in a functional group independent manner, and therefore a much variety of compounds can be fixed compared with the conventional fixing method. Since the fixed low-molecular compound binds to the solid-phase support at various sites on its molecule, every site of the low-molecular compound is exposed at the surface of the solid-phase support, which enables to totally examine the binding property or the like of the low-molecular compound.

What is claimed is:

1. A method of fixing a low-molecular compound on a solid-phase support, comprising the steps of:
   (1) bringing a solution containing a low-molecular compound into contact with a solid-phase support having a photoreactive compound bonded to the surface;
   (2) evaporating to dryness the solution containing the low-molecular compound in the state of being in contact with the solid-phase support; and
   (3) irradiating the solid-phase support with light to form a covalent bond between the photoreactive compound and the low-molecular compound.

2. The method of fixing a low-molecular compound on a solid-phase support according to claim 1, wherein the photoreactive compound is a compound capable of generating a nitrene, a carbene, a radical or a carbon electrophilic agent.

3. The method of fixing a low-molecular compound on a solid-phase support according to claim 1, wherein the photoreactive compound is a compound having a diazonium, azide, diazirine or diazo group as a part of the structure.

4. The method of fixing a low-molecular compound on a solid-phase support according to claim 1, wherein the photoreactive compound is a compound represented by formula (I):

(I)

wherein X denotes —N$_3$, —C*(R$^1$)N=N* (both the "*"s are linked together to form a three-membered ring), —N$_2$$^+$Z$^{31}$, —C(R$^2$)=O, —CH=CH$_2$, —NO$_2$, —NH$_2$, —C(=O)N$_3$, —Cl or —NH—CH$_2$—CO—CH=N$_2$; R$^1$ denotes a hydrogen atom, an alkyl group which may have a sutstituent or an aryl group which may have a substituent; R$^2$ denotes an aryl group which may have a substituent; Z$^-$ denotes an anion; any one of Y$^1$, Y$^2$, Y$^3$, Y$^4$ and Y$^5$ denotes a group which is capable of reacting with a functional group carried on the surface of the solid-phase support to form a covalent bond and the other four members independently to one another denote a hydrogen or halogen atom.

5. The method of fixing a low-molecular compound on a solid-phase support according to claim 1, wherein the solid-phase support is a microarray.

6. A low-molecular microarray which comprises a solid-phase support produced by the method as recited in claim 5.

7. A method of detecting a substance capable of interacting with a low-molecular compound, comprising the steps of:
   (1) bringing a low-molecular microarray as recited in claim 6 into contact with a solution which contains a test substance to be detected having a label;
   (2) removing any substance which fails to bind to the low-molecular compound; and
   (3) detecting the label of the test substance.

8. A method of identifying an interaction site on a low-molecular compound, comprising the steps of:
   (1) mixing a photoreactive compound with a low-molecular compound capable of interacting with a given substance;
   (2) irradiating the mixture with light to form a covalent bond between the photoreactive compound and the low-molecular compound;
   (3) separating complexes of the photoreactive compound and the low-molecular compound into different groups in accordance with the difference in binding site on the low-molecular compound;
   (4) fixing each of the separated complexes on a solid-phase support;
   (5) bringing the complexes fixed to the solid-phase support into contact with a solution containing the given compound which has a label; and
   (6) among the complexes fixed to the solid-phase support, selecting those complexes from which the label is not detected, to identify the binding site between the low-molecular compound and the photoreactive compound on the complexes.

9. The method of fixing a low-molecular compound on a solid-phase support according to claim 1, wherein the solid-phase support is beads.

10. Beads having a low-molecular compound fixed thereon produced by a method as recited in claim 1.

11. A method of purifying a substance capable of interacting with a low-molecular compound, comprising the steps of:
   (a) bringing beads as recited in claim 10 into contact with a solution containing a sample substance; and
   (b) removing any substances which are unbound to the low-molecular compound.

12. A method of detecting a substance capable of interacting with a low-molecular compound, comprising the steps of:
   (a) bringing beads as recited in claim 10 into contact with a solution containing a test substance to be detected which has a label;
   (b) removing any substances which fails to bind to the low-molecular compound; and
   (c) detecting the label of the test substance.

13. A method of fixing a low-molecular compound on a solid-phase support, comprising the steps of:
   (1) bringing a solution containing a low-molecular compound into contact with a solid-phase support having a photoreactive compound bonded to the surface;
   (2) evaporating to dryness the solution containing the low-molecular compound in the state of being in contact with the solid-phase support; and
   (3) irradiating the solid-phase support with light to form a covalent bond between the photoreactive compound and the low-molecular compound;
   wherein the low-molecular compound is an organic small molecule having primarily a carbon, hydrogen, oxygen, nitrogen or sulfur atom as the main constituent atom.

14. The method of claim 13, wherein the organic small molecule is selected from the group consisting of a primary metabolite of an oligosaceharide, or a polypeptide; a secondary metabolite of a fatty acid, a polyletide, isoprenoid, phenylpropanoid, or alkaroid; a synthetic organic compound of approximately 200 daltons in molecular weight and having an aromatic ring or a heterocyclic ring; and a complex thereof.

* * * * *